:::

(12) United States Patent
Zang et al.

(10) Patent No.: US 10,418,285 B1
(45) Date of Patent: Sep. 17, 2019

(54) FIN FIELD-EFFECT TRANSISTOR (FINFET) AND METHOD OF PRODUCTION THEREOF

(71) Applicant: GLOBALFOUNDRIES Inc., Grand Cayman (KY)

(72) Inventors: Hui Zang, Guilderland, NY (US); Chun Yu Wong, Ballston Lake, NY (US); Laertis Economikos, Wappingers Falls, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/993,142

(22) Filed: May 30, 2018

(51) Int. Cl.
*H01L 29/06* (2006.01)
*H01L 21/8234* (2006.01)

(52) U.S. Cl.
CPC ........... *H01L 21/823481* (2013.01); *H01L 21/823431* (2013.01); *H01L 21/823437* (2013.01)

(58) Field of Classification Search
CPC ..... H01L 21/823481; H01L 21/823431; H01L 21/823437

USPC .......................................................... 257/618
See application file for complete search history.

(56) References Cited

U.S. PATENT DOCUMENTS

| | | | |
|---|---|---|---|
| 8,846,491 B1 | 9/2014 | Pham et al. | |
| 9,331,074 B1 * | 5/2016 | Chang | H01L 27/0886 |
| 9,601,567 B1 * | 3/2017 | Hsieh | H01L 29/785 |
| 9,659,930 B1 * | 5/2017 | Yu | H01L 21/823431 |
| 9,899,267 B1 * | 2/2018 | Liou | H01L 21/823878 |
| 9,923,078 B2 * | 3/2018 | Greene | H01L 29/665 |
| 10,043,712 B1 * | 8/2018 | Hsu | H01L 21/823437 |
| 2016/0190130 A1 | 6/2016 | Yu et al. | |

* cited by examiner

*Primary Examiner* — Luan C Thai
(74) *Attorney, Agent, or Firm* — Ditthavong & Steiner, P.C.

(57) ABSTRACT

Methods of forming a CT pillar with reduced width and increased distance from neighboring fins and the resulting devices are provided. Embodiments include providing a first pair of fins and a second pair of fins in an oxide layer, wherein the first and second pair of fins include Si; and forming a CT pillar including SiN between the first and second pair of fins and over a portion of the oxide layer, wherein width of the CT pillar and distance between the CT pillar and the first and second pair of fins are inversely proportional.

16 Claims, 15 Drawing Sheets

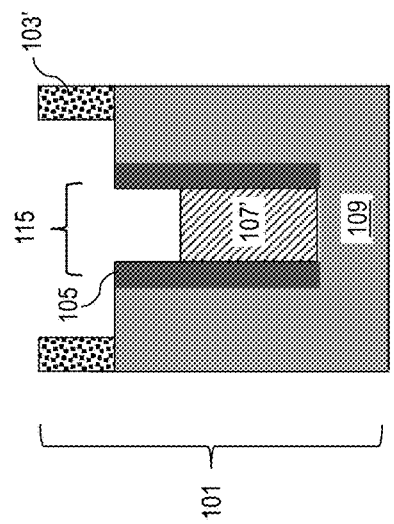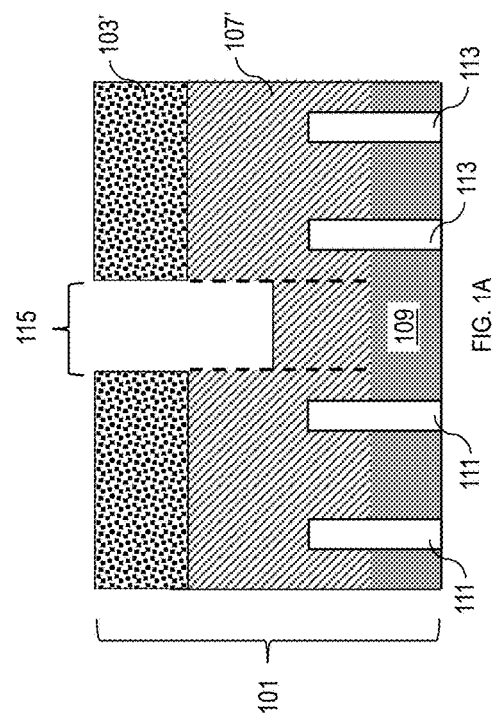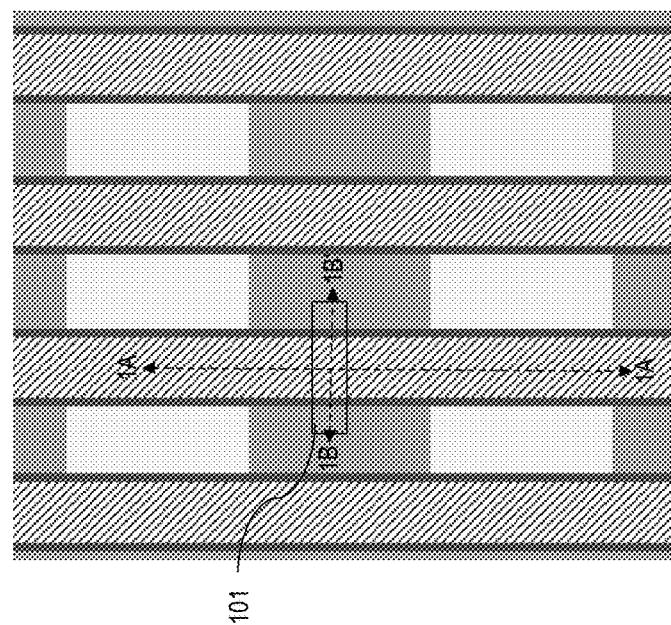

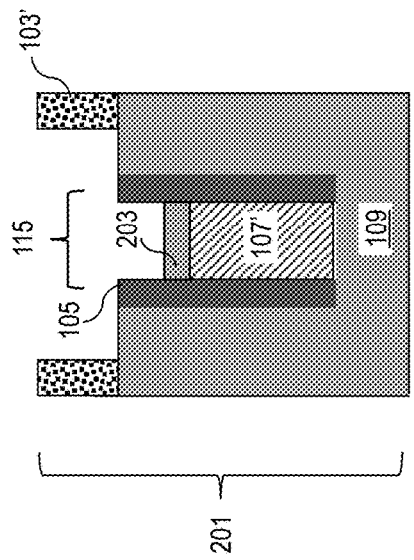
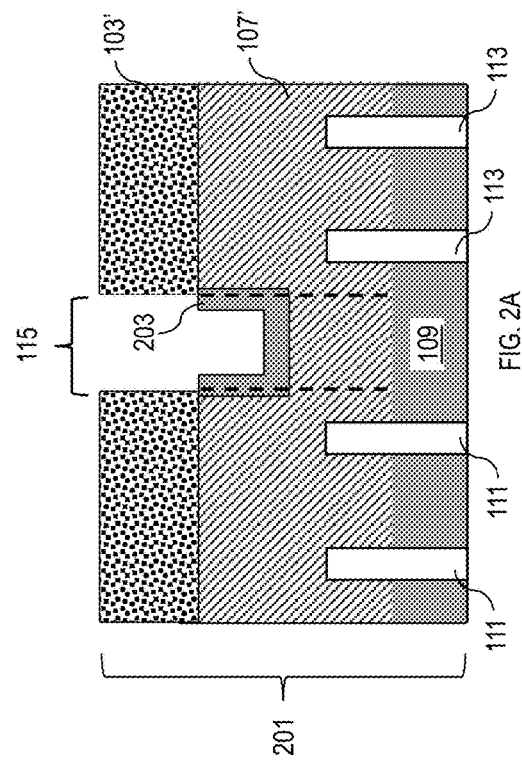
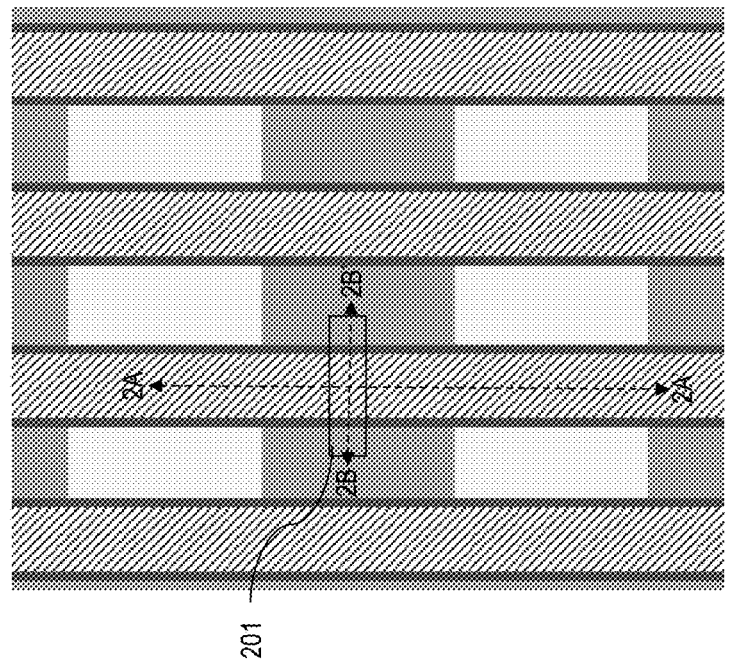

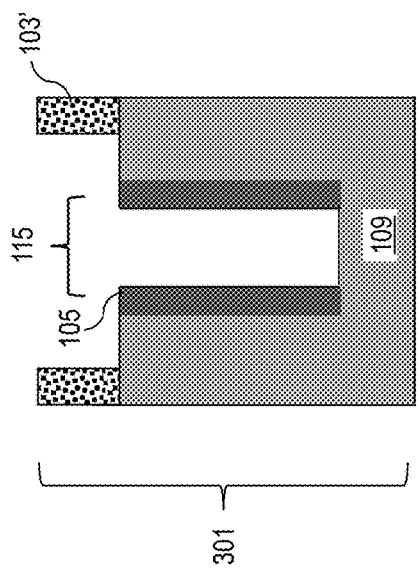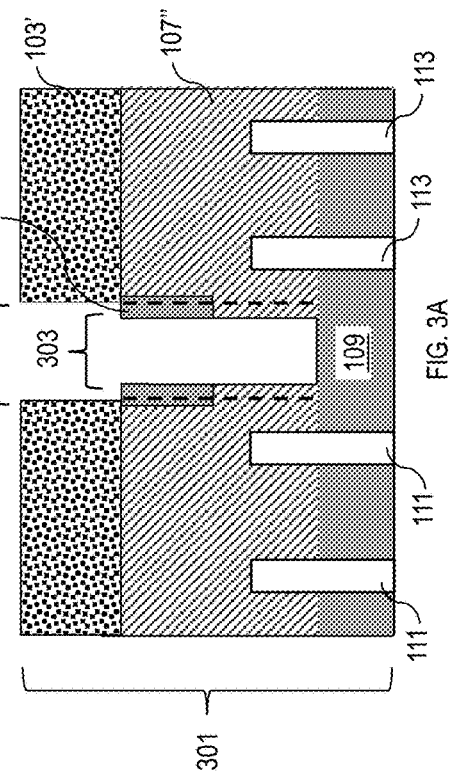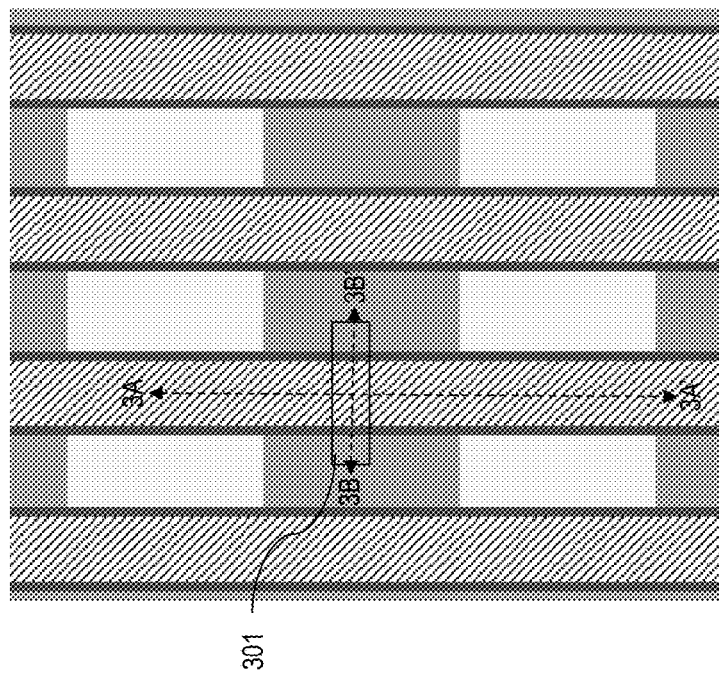

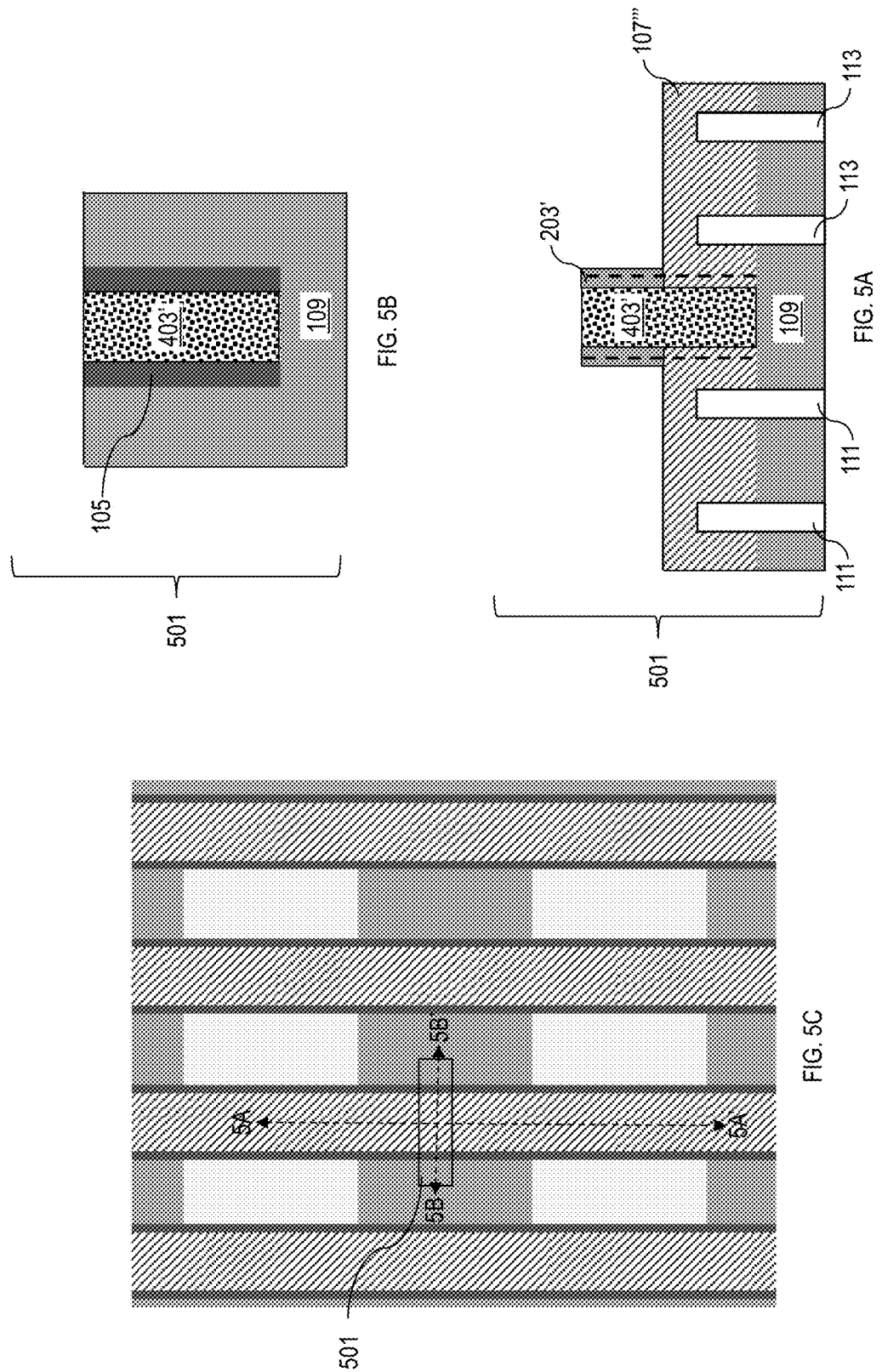

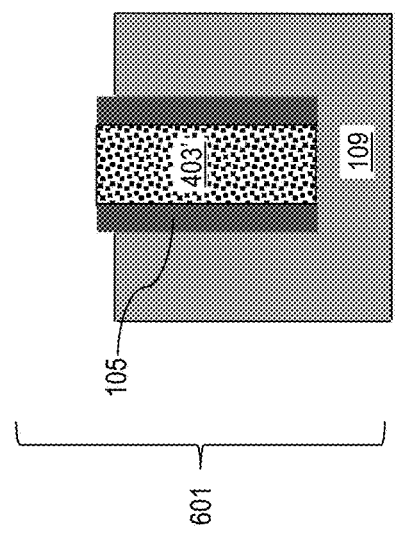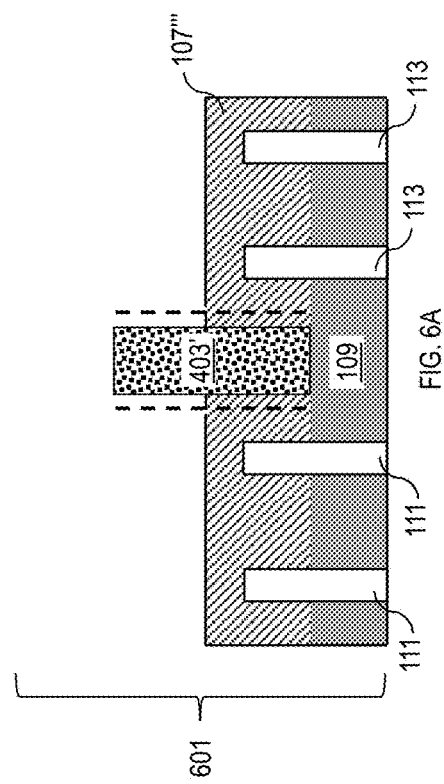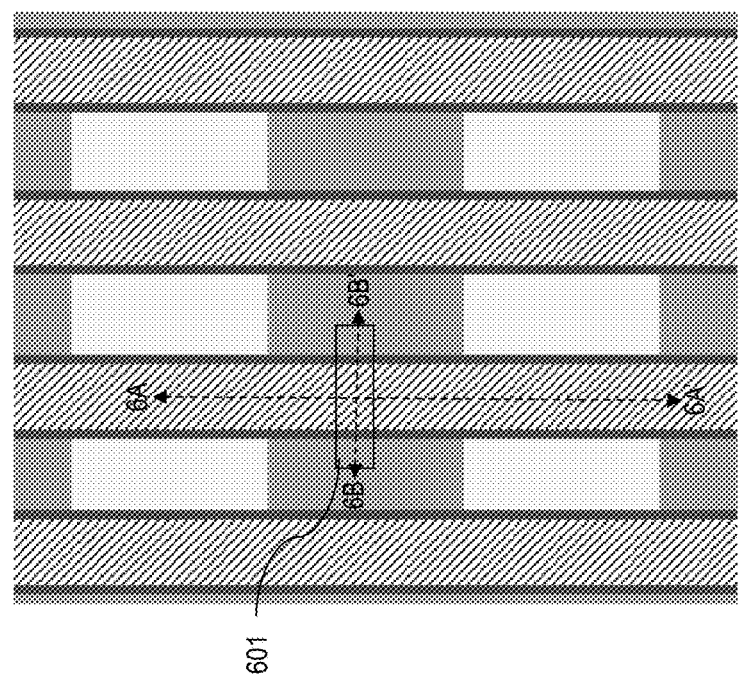

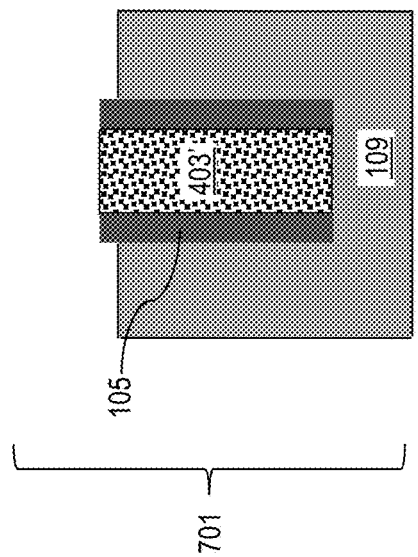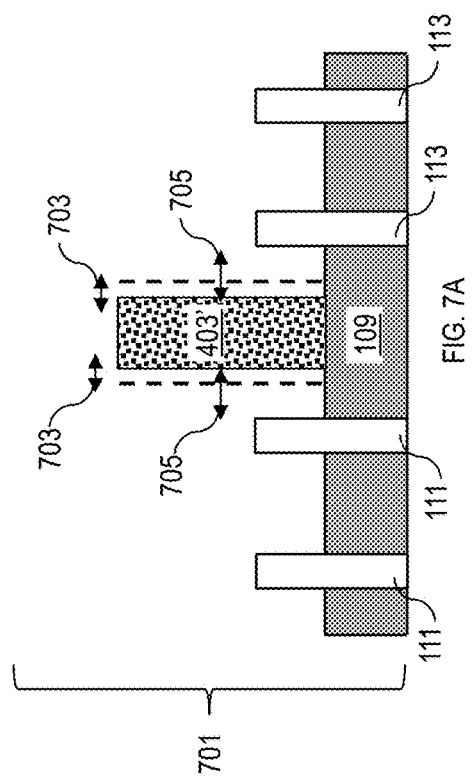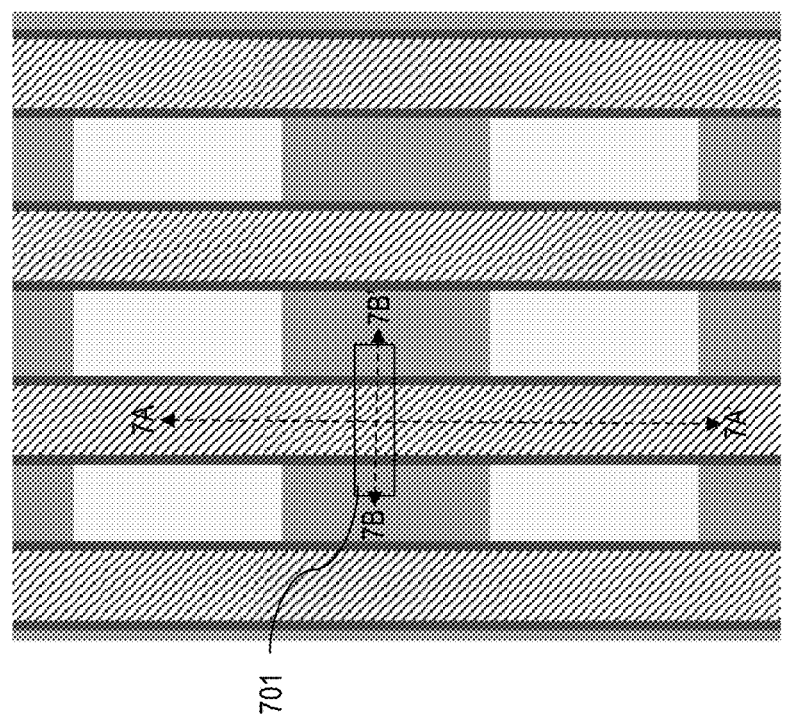

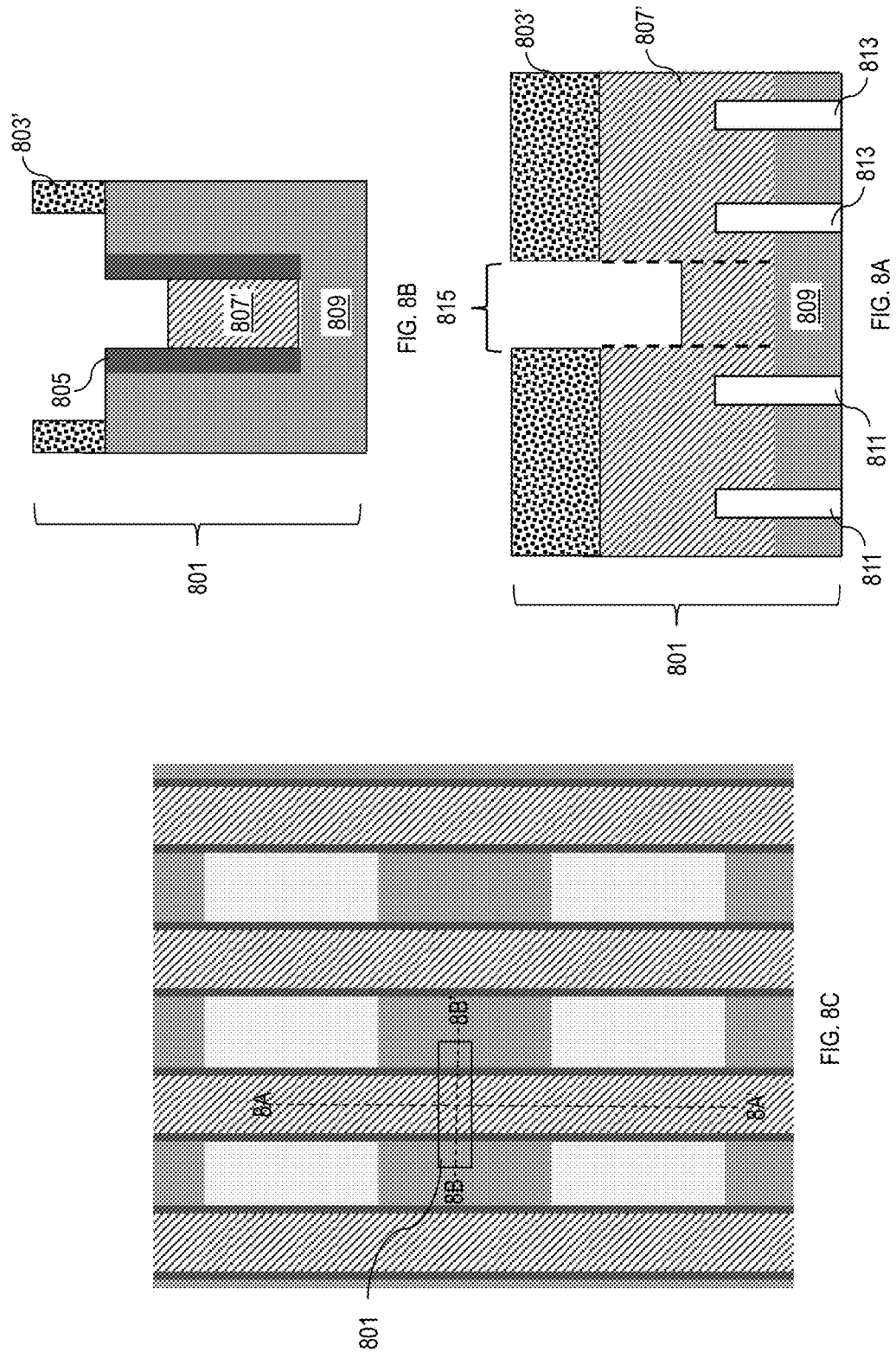

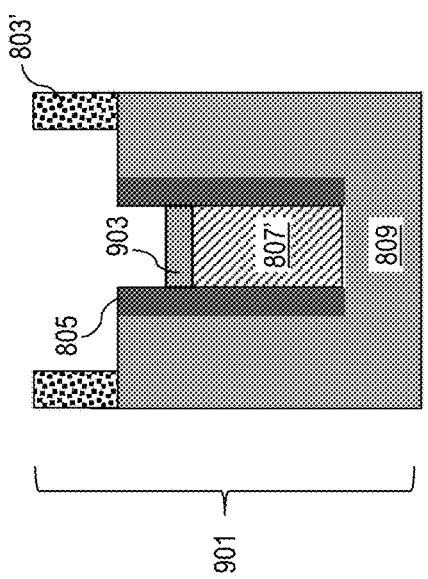
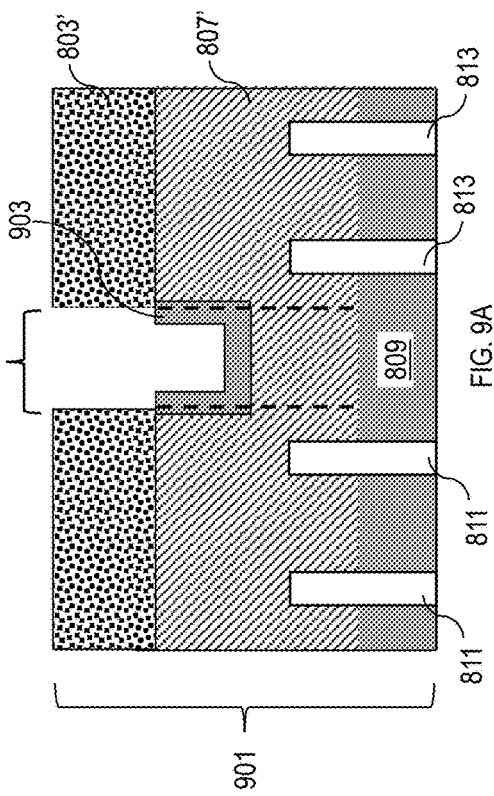
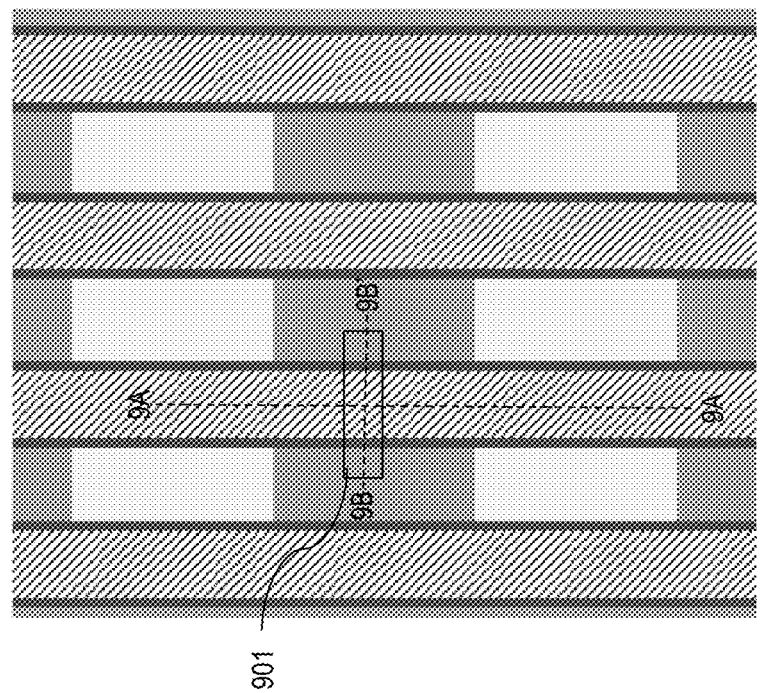

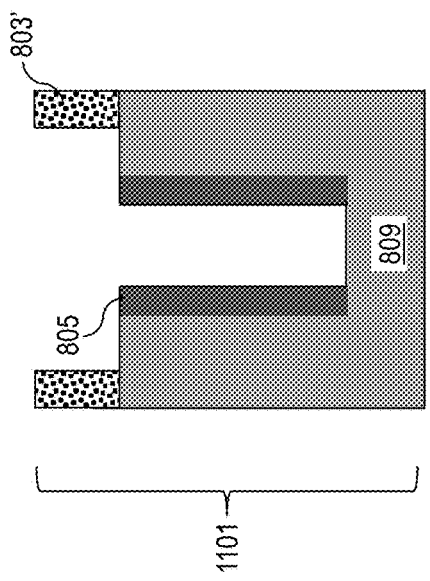
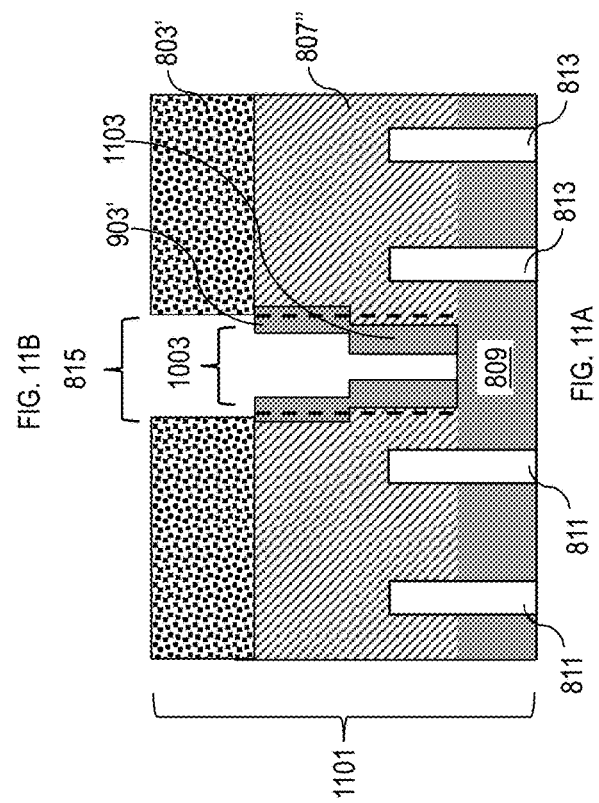
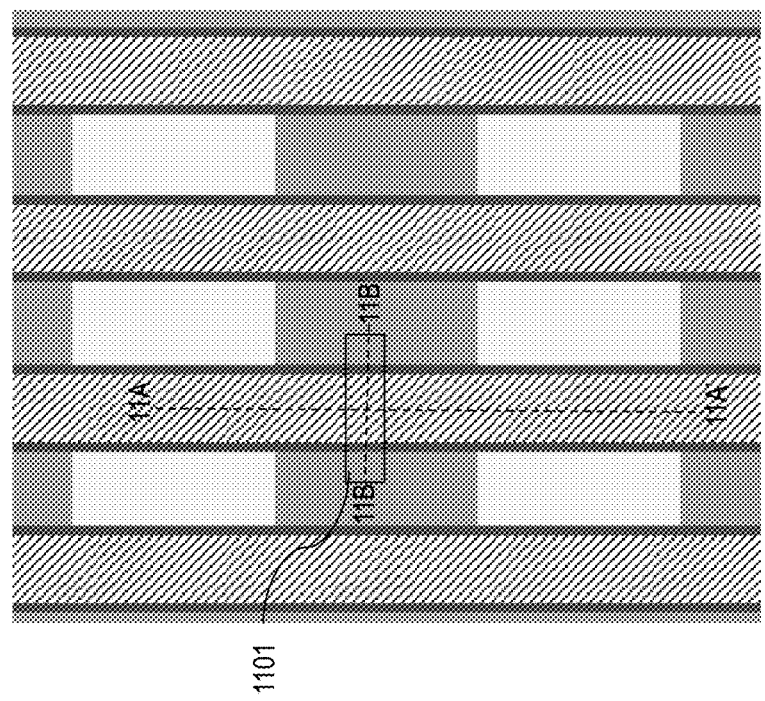

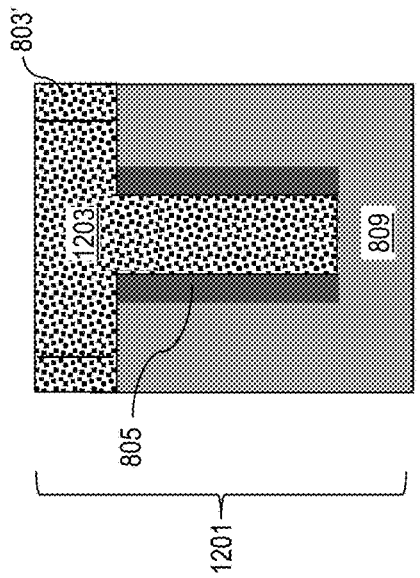
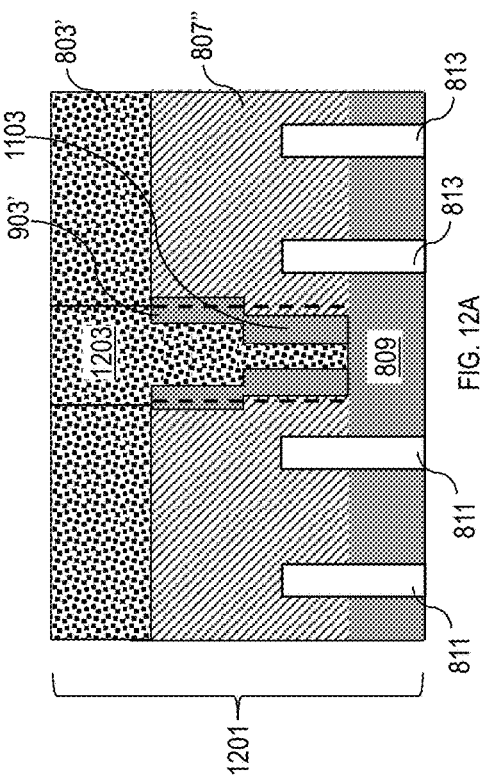
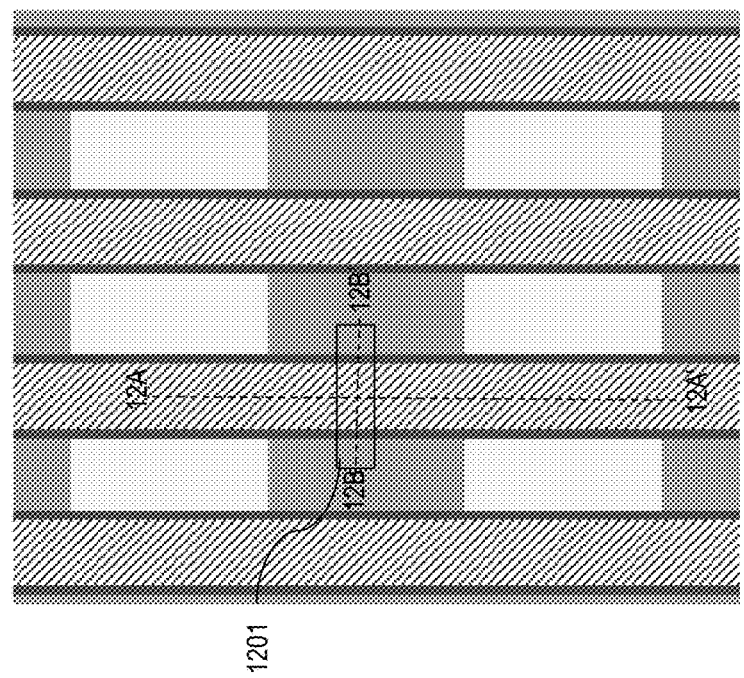

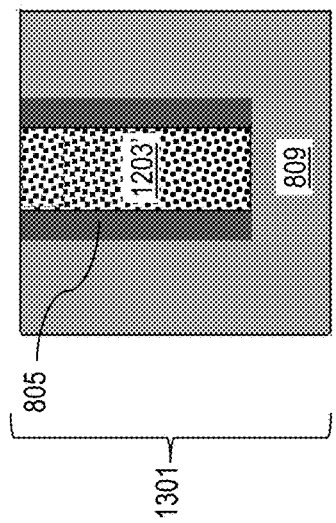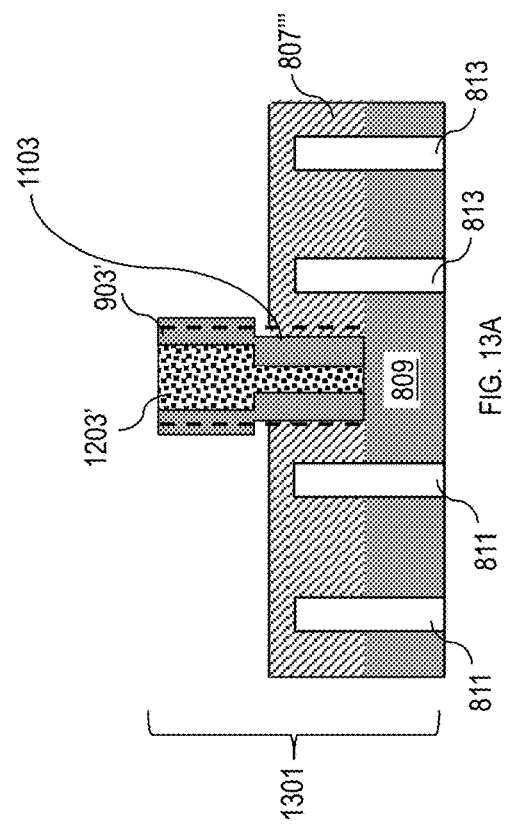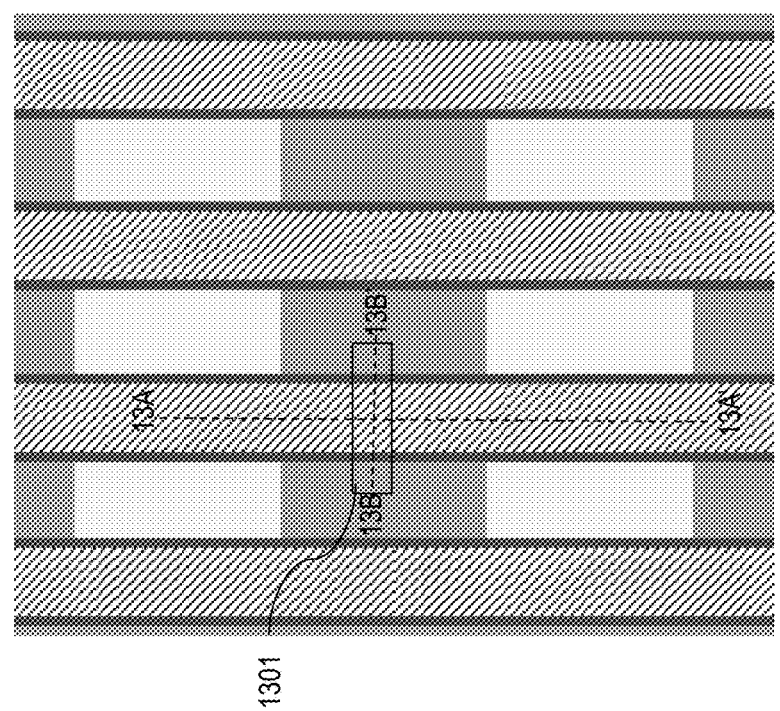

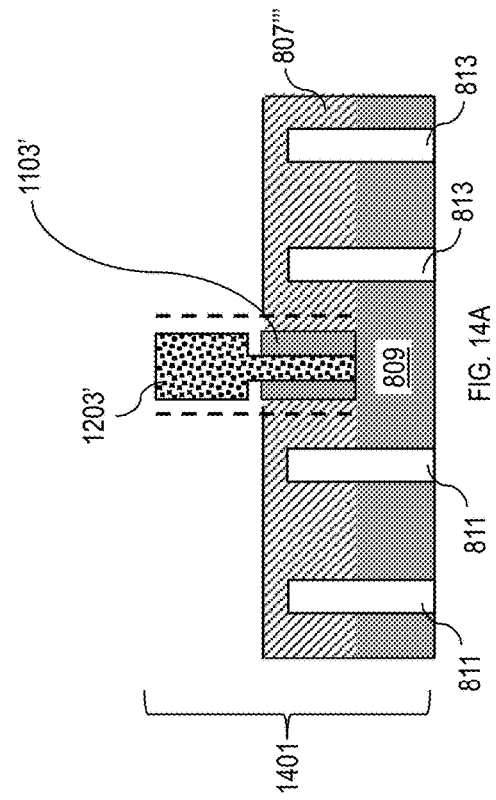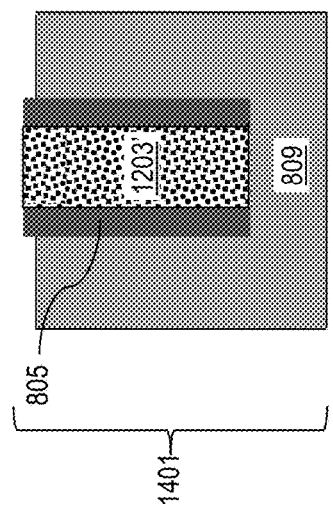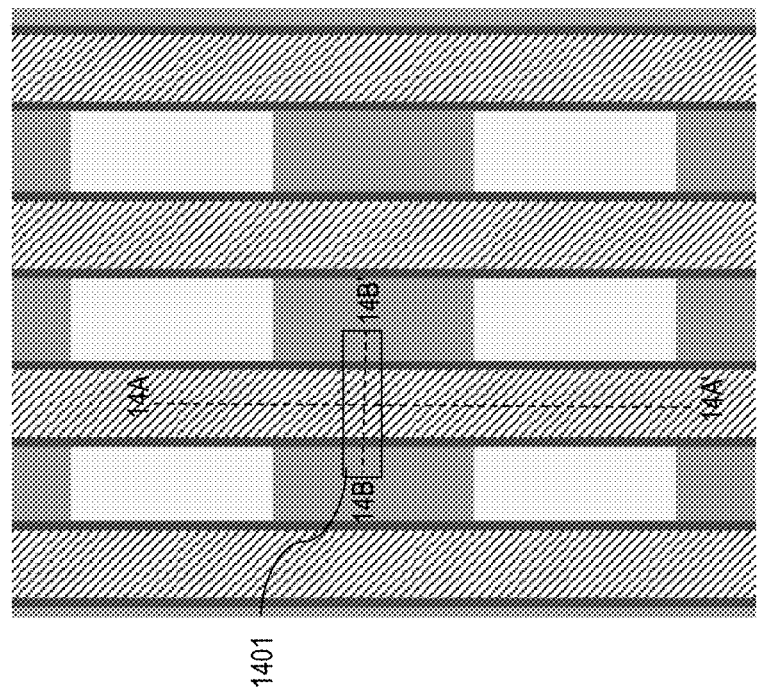

US 10,418,285 B1

FIN FIELD-EFFECT TRANSISTOR (FINFET) AND METHOD OF PRODUCTION THEREOF

TECHNICAL FIELD

The present disclosure relates to a fin field-effect transistor (FinFET) method of production thereof. The present disclosure is particularly applicable to the 7 nanometer (nm) technology node and beyond.

BACKGROUND

With aggressive scaling of the FinFET technology design rule, use of a gate cut (CT) pillar for gate (PC) isolation becomes increasingly challenging. For example, in 7 nm technology, an incomplete CT is observed after the poly-open-chemical-mechanical-polishing (POC), thereby resulting in a PC to PC short. Though increasing the process time for a CT reactive-ion etching (RIE) may resolve this issue, it causes an increase in critical dimension (CD) of a CT. A large CD of CT reduces the process margin that may result in voids during work function (WF) metal fill.

A need, therefore, exists for devices with improved CT process margins with increased distance between the CT pillar and the fins in PC tip-to-tip, and for enabling methodology.

SUMMARY

An aspect of the present disclosure is a device including a CT pillar with reduced width and increased distance from neighboring fins.

Another aspect of the present disclosure is a method of forming a CT pillar with reduced width and increased distance from neighboring fins.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a device including: a first pair of fins and a second pair of fins in an oxide layer, wherein the first and second pair of fins includes silicon (Si); and a CT pillar includes silicon nitride (SiN) between the first and second pair of fins and over a portion of the oxide layer, wherein width of the CT pillar and distance between the CT pillar and the first and second pair of fins are inversely proportional.

Another aspect of the present disclosure is a method including providing a first pair of fins and a second pair of fins in an oxide layer, wherein the first and second pair of fins includes Si; and forming a CT pillar that includes SiN between the first and second pair of fins and over a portion of the oxide layer, wherein width of the CT pillar and distance between the CT pillar and the first and second pair of fins are inversely proportional.

A further aspect of the present disclosure is a device including a first pair of fins and a second pair of fins having a thickness of 5 nm to 22 nm in an oxide layer, wherein the first and second pair of fins includes Si; and a CT pillar that includes SiN between the first and second pair of fins and over a portion of the oxide layer, wherein width of the CT pillar is 12 nm to 40 nm and distance between the CT pillar and the first and second pair of fins is 10 nm to 35 nm.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which:

FIGS. 1A, 1B through 7A, 7B, respectively, schematically illustrate cross-sectional views of a process flow for forming a CT pillar having a reduced width, in accordance with an exemplary embodiment;

FIGS. 1C through 7C are top views showing the cut lines for FIGS. 1A, 1B through 7A, 7B, respectively;

FIGS. 8A, 8B through 15A, 15B, respectively, schematically illustrate cross-sectional views of a process flow for forming a T-shaped CT pillar having a reduced width, in accordance with an exemplary embodiment; and FIGS. 8C through 15C are top views showing the cut lines for FIGS. 8A, 8B through 15A, 15B, respectively.

DETAILED DESCRIPTION

Figure 4B:
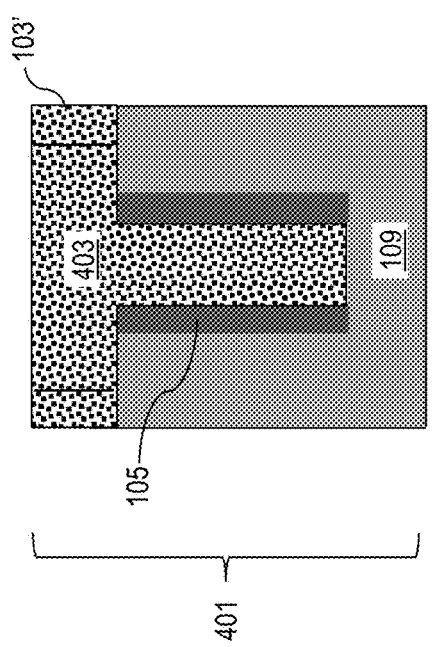

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problem of PC to PC short and reduced process margin attendant upon incomplete CT process or increased CT RIE process time. The problem is solved, inter alia, by implementing a stronger CT RIE process and oxidation of polysilicon (Poly-Si) gate.

Methodology in accordance with embodiments of the present disclosure includes providing a first pair of fins and a second pair of fins in an oxide layer, wherein the first and second pair of fins includes Si. A CT pillar that includes SiN is then formed between the first and second pair of fins and over a portion of the oxide layer, wherein width of the CT pillar and distance between the CT pillar and the first and second pair of fins are inversely proportional.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects.

Accordingly, the drawings and description are to be regarded as illustrative in nature, and not as restrictive.

FIGS. 1A, 1B through 7A, 7B, respectively, schematically illustrate cross-sectional views of a process flow for forming a CT pillar having a reduced width along the cut line 1A-1A', 1B-1B' through 7A-7A', 7B-7B', respectively of 101 through 701, respectively of FIGS. 1C through 7C, respectively, and FIGS. 1C through 7C are top views showing the cut lines for FIGS. 1A, 1B through 7A, 7B, respectively. Referring to FIGS. 1A and 1B, a hardmask 103, e.g., formed of SiN or any other materials with similar functional properties, and a low-K (LK) layer 105 are provided over and on sidewalls of a Poly-Si gate 107, respectively, and the Poly-Si gate 107 is provided over the oxide layer 109 and the fins 111 and 113 formed in the oxide layer 109. Next, a portion of the Poly-Si gate 107 is removed, e.g., by RIE or any other similar etching processes, through the hardmask 103, thereby forming hardmask 103', Poly-Si gate 107' and a cavity 115 having a width, e.g., of 12 nm to 40 nm. Thereafter, in FIGS. 2A and 2B, the surface and the sidewalls of the cavity 115 are oxidized, e.g., by thermal oxidation or any other similar oxidation processes, forming an oxide spacer 203 having a thickness, e.g., of 2 nm to 6 nm.

Figure 4A:
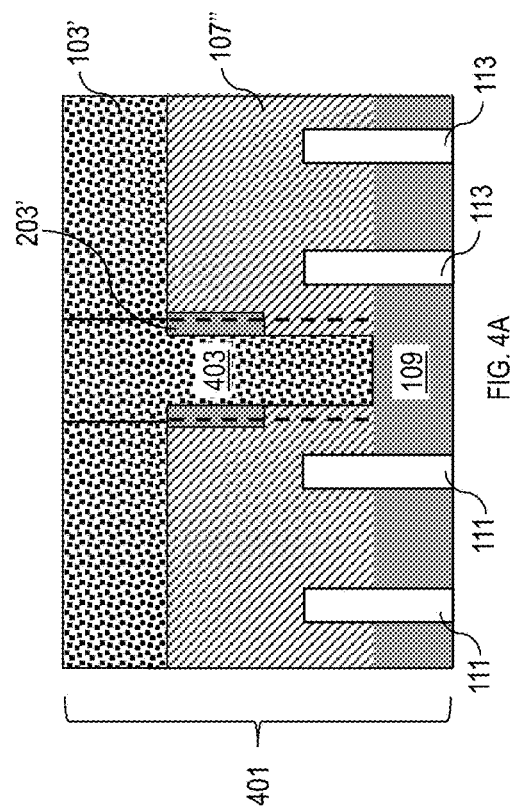
Figure 4C:
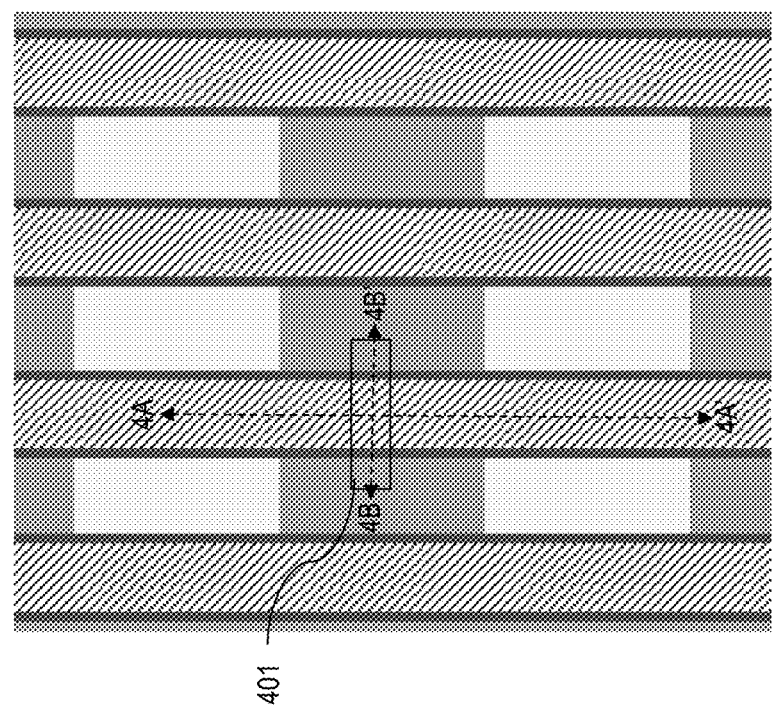

As illustrated in FIGS. 3A and 3B, a portion of the spacer 203 and the Poly-Si gate 107' is removed, e.g., by known etching processes, through the cavity 115 down to the oxide layer 109, thereby forming spacer 203', Poly-Si gate 107'' and a trench 303 having a depth, e.g., of 70 nm to 140 nm, and a width, e.g., of 12 nm to 40 nm. Referring to FIGS. 4A and 4B, a SiN layer 403 is formed in the trench 303 and the cavity 115, the upper surface of the SiN layer 403 is substantially coplanar to the upper surface of the hardmask 103'. In one instance, any other materials with similar functional properties to SiN may be formed in the trench 303 and the cavity 115. As depicted in FIGS. 5A and 5B, the SiN layer 403 and the hardmask 103' are planarized, e.g., by chemical mechanical planarization (CMP) or RIE, down to the Poly-Si gate 107'', forming a CT pillar 403' having a width, e.g., of 12 nm to 40 nm. Subsequently, a portion of the Poly-Si gate 107'' is removed, e.g., by wet etching or isotropic dry etching, thereby exposing spacer 203' on the sidewall portions of the CT pillar 403' and forming Poly-Si gate 107'''.

Referring to FIGS. 6A and 6B, the spacer 203' is removed. Thereafter in FIGS. 7A and 7B, the Poly-Si gate 107''' is removed, e.g., by wet etching or isotropic dry etching, exposing the CT pillar 403' and fins 111 and 113. The resultant CT pillar 403' has a reduced width as represented by 703 and an increased distance from fins 111 and 113 as represented by 705. In this instance, the distance between the CT pillar 403' and the fins 111 and 113 is 10 nm to 35 nm.

FIGS. 8A, 8B through 15A, 15B, respectively, schematically illustrate cross-sectional views of a process flow for forming a T-shaped CT pillar having a reduced width along the cut line 8A-8A', 8B-8B' through 15A-15A', 15B-15B', respectively of 801 through 1501, respectively of FIGS. 8C through 15C, respectively, and FIGS. 8C through 15C are top views showing the cut lines for FIGS. 8A, 8B through 15A, 15B, respectively. The process steps for FIGS. 8A, 8B through 10A, 10B are similar to the process steps for FIGS. 1A, 1B through 3A, 3B. Referring to FIGS. 8A and 8B, a hardmask 803, e.g., formed of SiN or any other materials with similar functional properties, and a LK layer 805 are provided over and on sidewalls of a Poly-Si gate 807, respectively, and the Poly-Si gate 807 is provided over the oxide layer 809 and the fins 811 and 813 formed in the oxide layer 809. Next, a portion of the Poly-Si gate 807 is removed, e.g., by RIE or any other similar etching processes, through the hardmask 803, thereby forming hardmask 803', Poly-Si gate 807' and a cavity 815 having a width, e.g., of 12 nm to 40. Thereafter, in FIGS. 9A and 9B, the surface and the sidewalls of the cavity 815 are oxidized, e.g., by thermal oxidation or any other similar oxidation processes, forming oxide spacer 903 having a thickness, e.g., of 2 nm to 6 nm.

Figure 10B:
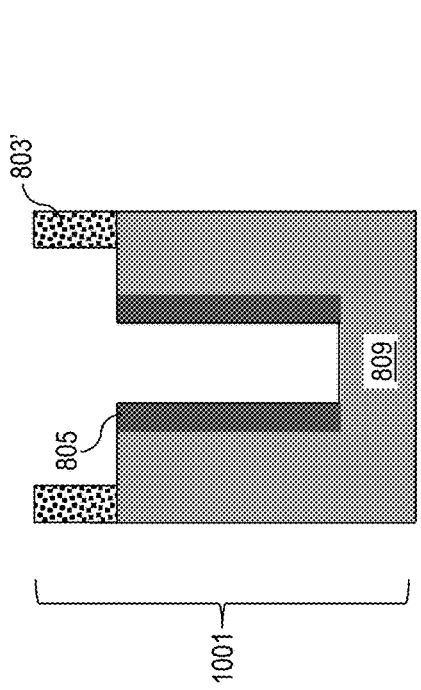
Figure 10A:
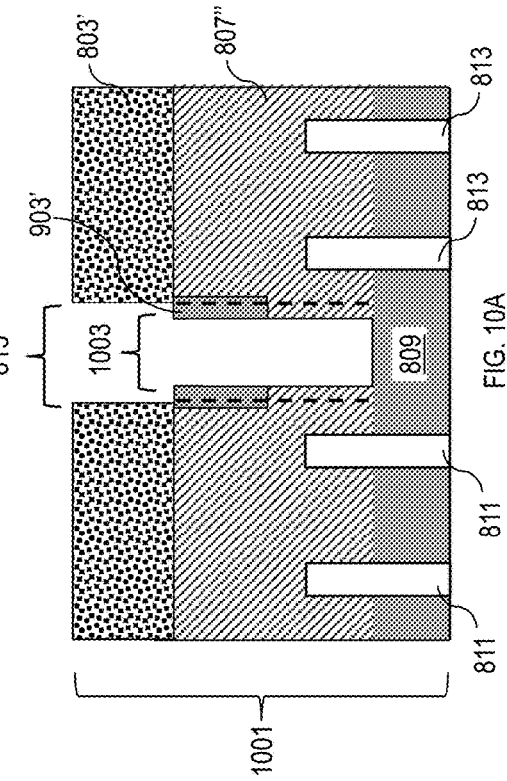
Figure 10C:
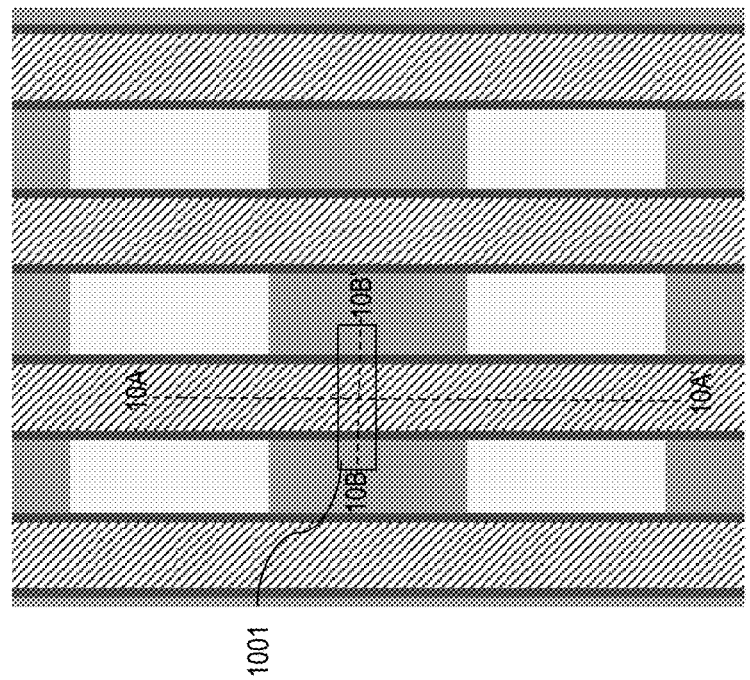
Figure 15B:
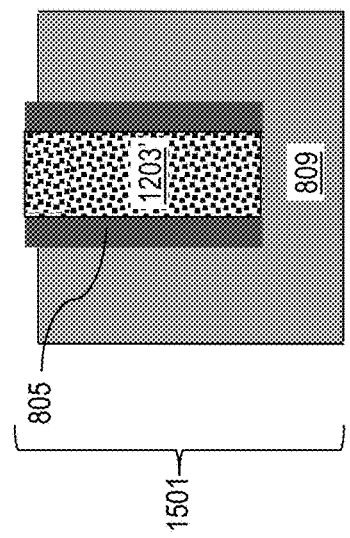
Figure 15A:
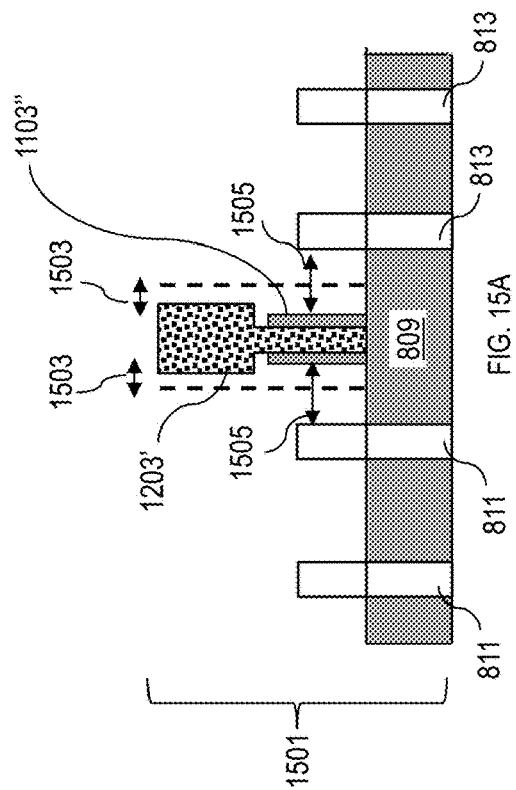
Figure 15C:
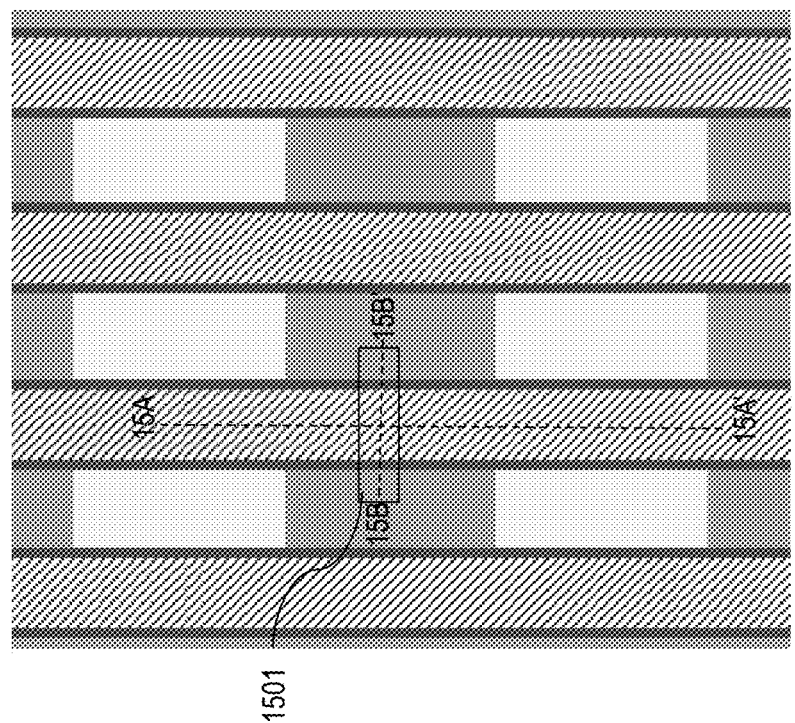

As illustrated in FIGS. 10A and 10B, a portion of the spacer 903 and the Poly-Si gate 807' is removed, e.g., by known etching processes, through the cavity 815 down to the oxide layer 809, thereby forming spacer 903', Poly-Si gate 807'' and a trench 1003 having a depth, e.g., of 70 nm to 140 nm, and a width, e.g., of 12 nm to 40 nm. Thereafter in FIGS. 11A and 11B, a spacer 1103 is formed, e.g., by oxidation to a width of 2 nm to 6 nm, along the sidewalls of a lower portion of the trench 1003, wherein the spacer 1103 reduces the width of the lower portion of the trench 1003.

The process steps for FIGS. 12A, 12B and 13A, 13B are similar to the process steps for FIGS. 4A, 4B and 5A, 5B. Referring to FIGS. 12A and 12B, a SiN layer 1203 is formed in the trench 1003 and the cavity 815, the upper surface of the SiN layer 1203 is substantially coplanar to the upper surface of the hardmask 803'. In one instance, any other materials with similar functional properties to SiN may be formed in the trench 1003 and the cavity 815. As depicted in FIGS. 13A and 13B, the SiN layer 1203 and the hardmask 803' are planarized, e.g., by CMP or RIE, down to the Poly-Si gate 807'', forming a T-shaped CT pillar 1203', wherein the upper portion of the T-shaped CT pillar 1203' has a width, e.g., of 12 nm to 40 nm, and the lower portion of the T-shaped CT pillar 1203' has a width, e.g., of 8 nm to 30 nm. Subsequently, a portion of the Poly-Si gate 807'' is removed, e.g., by wet etching or isotropic dry etching, thereby exposing spacer 903' and a portion of the spacer 1103 and forming Poly-Si gate 807'''.

Referring to FIGS. 14A and 14B, the spacer 903' and the exposed portion of the spacer 1103 are removed, thereby forming spacer 1103'. Thereafter in FIGS. 15A and 15B, the Poly-Si gate 807''' is removed, e.g., by wet etching or isotropic dry etching, thereby exposing the T-shaped CT pillar 1203', the spacer 1103' and fins 811 and 813. Subsequently, a portion of the width of the spacer 1103' is removed, e.g., by known etching processes, thereby forming spacer 1103''. The resultant T-shaped CT pillar 1203' has a reduced width as represented by 1503 and an increased distance from fins 811 and 813 as represented by 1505. In this instance, the distance between the CT pillar 1203' and the fins 811 and 813 is 10 nm to 35 nm.

The embodiments of the present disclosure can achieve several technical effects, such as smaller CT CD and increased distance between the CT pillar and the neighboring fins. Devices formed in accordance with embodiments of the present disclosure enjoy utility in various industrial applications, e.g., microprocessors, smart phones, mobile phones, cellular handsets, set-top boxes, DVD recorders and players, automotive navigation, printers and peripherals, networking and telecom equipment, gaming systems, and digital cameras. The present disclosure enjoys industrial applicability in any of various types of semiconductor devices, particularly in the 7 nm technology node and beyond.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A device comprising:
   a first pair of fins and a second pair of fins in an oxide layer, wherein the first and second pair of fins comprises silicon (Si); and
   a gate cut (CT) pillar comprising silicon nitride (SiN) between the first and second pair of fins and over a portion of the oxide layer, wherein width of the CT pillar and distance between the CT pillar and the first and second pair of fins are inversely proportional,
   wherein a bottom portion of the CT pillar has a width thinner than a width of an upper portion of the CT pillar, and
   wherein the bottom portion of the CT pillar includes sidewall spacers and the upper portion of the CT pillar does not include the sidewall spacers.

2. The device according to claim 1, wherein the CT pillar has a width of 12 nanometer (nm) to 40 nm.

3. The device according to claim 1, wherein the bottom portion of the CT pillar has a width of 8 nm to 30 nm.

4. The device according to claim 1, wherein a distance between the CT pillar and the first and second pairs of fins is 10 nm to 35 nm.

5. The device according to claim 1, wherein the sidewall spacers have a width of 2 nm to 6 nm.

6. A method comprising:
   providing a first pair of fins and a second pair of fins in an oxide layer, wherein the first and second pair of fins comprises silicon (Si); and
   forming a gate cut (CT) pillar comprising silicon nitride (SiN) between the first and second pair of fins and over a portion of the oxide layer, wherein the CT pillar is formed by:
      providing a polysilicon (Poly-Si) gate over the first and second pair of fins and the oxide layer;
      providing a hardmask over the Poly-Si gate;
      removing a first portion of the Poly-Si gate through the hardmask, forming a cavity;
      forming a spacer over the Poly-Si gate and along sidewalls of the cavity;
      removing a portion of the spacer and the Poly-Si gate down to the oxide layer, forming a trench;
      forming a silicon nitride (SiN) layer in the trench and the cavity, upper surface of the SiN layer substantially coplanar to upper surface of the hardmask;
      planarizing the SiN layer and the hardmask down to the Poly-Si gate;
      removing a second portion of the Poly-Si gate, exposing the spacer;
      removing the spacer; and
      removing a third portion of the Poly-Si gate, thereby forming the CT pillar,
   wherein width of the CT pillar and distance between the CT pillar and the first and second pair of fins are inversely proportional.

7. The method according to claim 6, further comprising:
   forming a second spacer along sidewalls of a lower portion of the trench, the second spacer reducing width of the lower portion of the trench.

8. The method according to claim 6, wherein removing the second portion of the Poly-Si gate further comprising:
   exposing a portion of the second spacer; and
   removing the exposed portion of the second spacer.

9. The method according to claim 6, wherein removing the third portion of the Poly-Si gate further comprising:
   exposing remaining portion of the second spacer; and
   removing a portion of the remaining second spacer.

10. The method according to claim 6, comprising forming the CT pillar to a width of 12 nanometer (nm) to 40 nm.

11. The method according to claim 7, wherein bottom portion of the CT pillar has a thinner width than upper portion.

12. The method according to claim 11, comprising forming the bottom portion of the CT pillar to a width of 8 nm to 30 nm.

13. The method according to claim 10, wherein distance between the CT pillar and the first and second pair of fins is 10 nm to 35 nm.

14. The method according to claim 7, comprising forming the spacer and the second spacer by oxidation to a thickness that is proportional to the width of the SiN layer.

15. A device comprising:
    a first pair of fins and a second pair of fins having a thickness of 5 nanometer (nm) to 22 nm in an oxide layer, wherein the first and second pair of fins comprises silicon (Si); and
    a gate cut (CT) pillar comprising silicon nitride (SiN) between the first and second pair of fins and over a portion of the oxide layer, wherein width of the CT pillar is 12 nm to 40 nm and distance between the CT pillar and the first and second pair of fins is 10 nm to 35 nm,
    wherein a bottom portion of the CT pillar has a width thinner than a width of an upper portion of the CT pillar, and
    wherein the bottom portion of the CT pillar includes sidewall spacers and the upper portion of the CT pillar does not include the sidewall spacers.

16. The device according to claim 15, wherein the bottom portion of the CT pillar has a width of 8 nm to 30 nm.

* * * * *